United States Patent [19]

Ross et al.

[11] Patent Number: 4,695,752
[45] Date of Patent: Sep. 22, 1987

[54] NARROW RANGE GATE BASEBAND RECEIVER

[75] Inventors: Gerald F. Ross, Lexington; Kenneth W. Robbins, Wilmington, both of Mass.

[73] Assignee: Sperry Corporation, New York, N.Y.

[21] Appl. No.: 345,310

[22] Filed: Jan. 11, 1982

[51] Int. Cl.[4] .......................... G01R 29/02; G01S 7/28
[52] U.S. Cl. ..................................... 307/518; 307/286; 307/322; 307/592; 307/602; 342/21
[58] Field of Search ....................... 307/518, 286, 322; 328/109, 110; 343/5 BB, 17.1 R; 342/21, 202; 377/119, 122, 124

[56] References Cited

U.S. PATENT DOCUMENTS

| 3,562,551 | 2/1971 | Fowler, Jr. | 377/119 X |
| 3,813,558 | 5/1974 | Krick et al. | 307/286 X |
| 3,889,134 | 6/1975 | Basham | 307/286 X |

Primary Examiner—T. H. Tubbesing
Attorney, Agent, or Firm—Howard P. Terry; Seymour Levine

[57] ABSTRACT

A baseband receiver with a range gate interval in the order of nanoseconds. A tunnel diode, set to the low level state, is coupled across the output terminals of a bridge that is balanced in the absence of a received signal, during the range gate interval. Signals received by an antenna are coupled to a tunnel diode in an arm of the bridge causing it to change from its low level state to its high level state thereby unbalancing the bridge and establishing a voltage at the output terminals of the bridge that fires the tunnel diode coupled thereacross.

9 Claims, 3 Drawing Figures

NARROW RANGE GATE BASEBAND RECEIVER

BACKGROUND OF THE INVENTION

1. Field of the Invention

The present invention relates to baseband receivers, and more particularly to baseband receivers having high sensitivities within a narrow range gate.

2. Description of the Prior Art

A need exists for a sensitive baseband receiver operable within a range gate of several nanoseconds that provides range resolutions in the order of feet. Such a receiver may act as a spatial filter to substantially reduce chaff interference, may be utilized for target profile discrimination, and may act as the clutter filter by adjusting a range gate to provide a range window that excludes the clutter source. A receiver of this type should be held in the "OFF" state except for a short interval, measured in nanoseconds, during which it is switched to the "ON" state. The sensitivity of the receiver in the "ON" state should be in the order of millivolts, while in the "OFF" state it should not respond to signals in the order of half a volt.

To achieve the desired characteristics, it is necessary to attenuate the gain transients by more than 50 dB in a fraction of a nanosecond to prevent false triggering (i.e., receiver triggering on the rise or fall of the range gate pulse itself). Additionally, significant pulse stretching must be performed since the signal can enter the range gate at the beginning or end of the time window, resulting in output pulses that range from a small fraction of a range gate width to a range gate width. These pulses contain insufficient energy to trigger the logic circuit in the following CFAR registers and must be stretched. Baseband receivers of the prior art, such as the types disclosed in U.S. Pat. No. 3,662,316 issued to K. W. Robbins in May 1972 and U.S. Pat. No. 3,750,025 issued to G. F. Ross in July 1973, both assigned to the assignee of the present invention, do not provide the desired sensitivity and in some instances do not possess range gated operation.

SUMMARY OF THE INVENTION

A range gated baseband receiver in accordance with the invention utilizes two highly sensitive tunnel diodes, initially biased in the insensitive high states, coupled with opposing polarities in a bridge circuit. One diode is additionally coupled to an antenna while the second has no external coupling. The anode of one and the cathode of the other tunnel diode are respectively coupled to a node where the sum of their output signals is realized. A third tunnel diode, which has a higher triggering threshold than the oppositely poled tunnel diodes, is coupled to the sum node and a resetting circuit. This diode and resetting circuit combination provides an output signal level and pulse duration which may be processed by CFAR receivers, as for example, the CFAR receiver disclosed in U.S. Pat. No. 3,983,422, issued to Nicholson et al and assigned to the assignee of the present invention.

Range gates, of substantially equal duration and opposite polarity, from a range gate generator, are coupled via differentiating circuits to the oppositely poled tunnel diodes. The leading pulse of the doublets formed by the differentiating circuits reset the oppositely poled tunnel diodes to their sensitive low states, while the second pulse of the doublet resets these tunnel diodes to their insensitive high states. Since the sum of the tunnel diode signals is coupled to the sum node, the signal thereat is substantially zero at all times in the absence of a signal received from the antenna. When a signal is coupled from the antenna, the bridge balance is disturbed causing the null at the sum node to be replaced by a signal level representative of the received signal. This circuit unbalance can only occur during the period in which the oppositely poled tunnel diodes are in their low state, i.e., during the range gate interval, for the received signal is incapable of causing the tunnel diode to which it is coupled to change from an initial high level state. Thus, only during the range gate interval can a signal appear at the sum node. This signal cuases the third tunnel diode to change from a low level to a high level state. After the transition the third tunnel diode is reset to the low level state by the resetting circuit coupled thereto. The resulting pulse output is then coupled to CFAR registers for processing.

The oppositely poled tunnel diodes are so sensitive that a signal resulting from the generation of the positive range gate can trigger the positively poled tunnel diode. To avoid such false alarms delays are appropriately introduced to activate and deactivate the positively poled tunnel diode by the negative range gate before the positive range gate is coupled to the bridge circuit. The delays between the range gate generator and the oppositely poled tunnel diodes and the delay between these diodes and the sum node are adjusted such that the total delay from the range gate generator to the sum node is equal for each path, thus maintaining a null at the sum node at all times in the absence of a signal coupled to the bridge circuit from the receiving antenna.

In a second embodiment of the invention, the second tunnel diode, the one not coupled to the receiving antenna, is removed. A window of sensitivity for the first tunnel diode in the bridge circuit, the one coupled to the antenna, is established as previously described. A pulse of substantially equal amplitude but of opposite polarity to the voltage coupled to the bridge from the first tunnel diode in its low level state is coupled to the bridge during the sensitivity interval to establish a null at the sum node. Transitions of the first tunnel diode during the window interval, caused by signals coupled from the receiving antenna upset the bridge balance and establish a signal at the sum node that is detected by the third tunnel diode.

DESCRIPTION OF THE PREFERRED EMBODIMENTS

Figure 1:
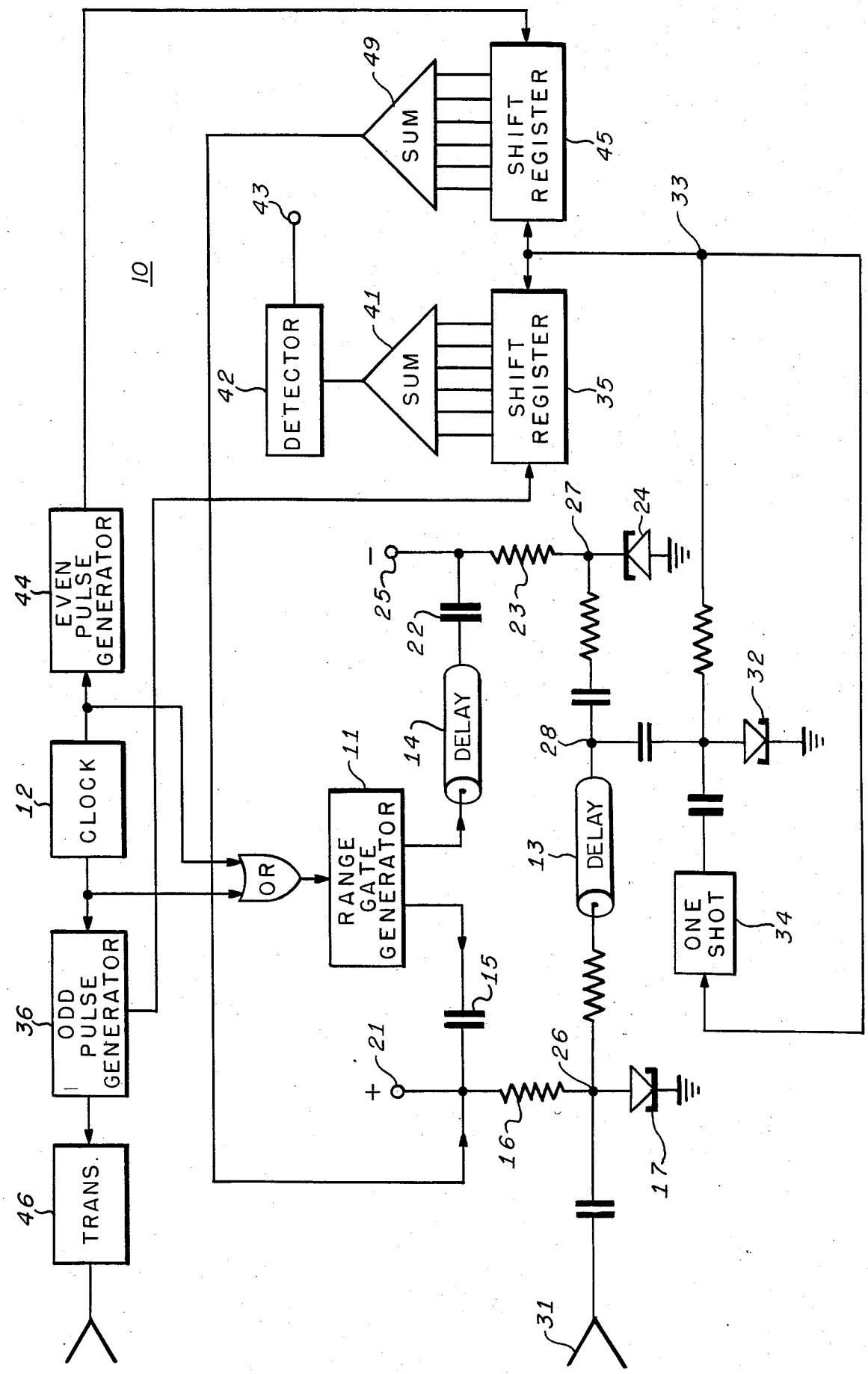
FIG. 1 is a schematic diagram of a first preferred embodiment of the invention.
Figure 2:
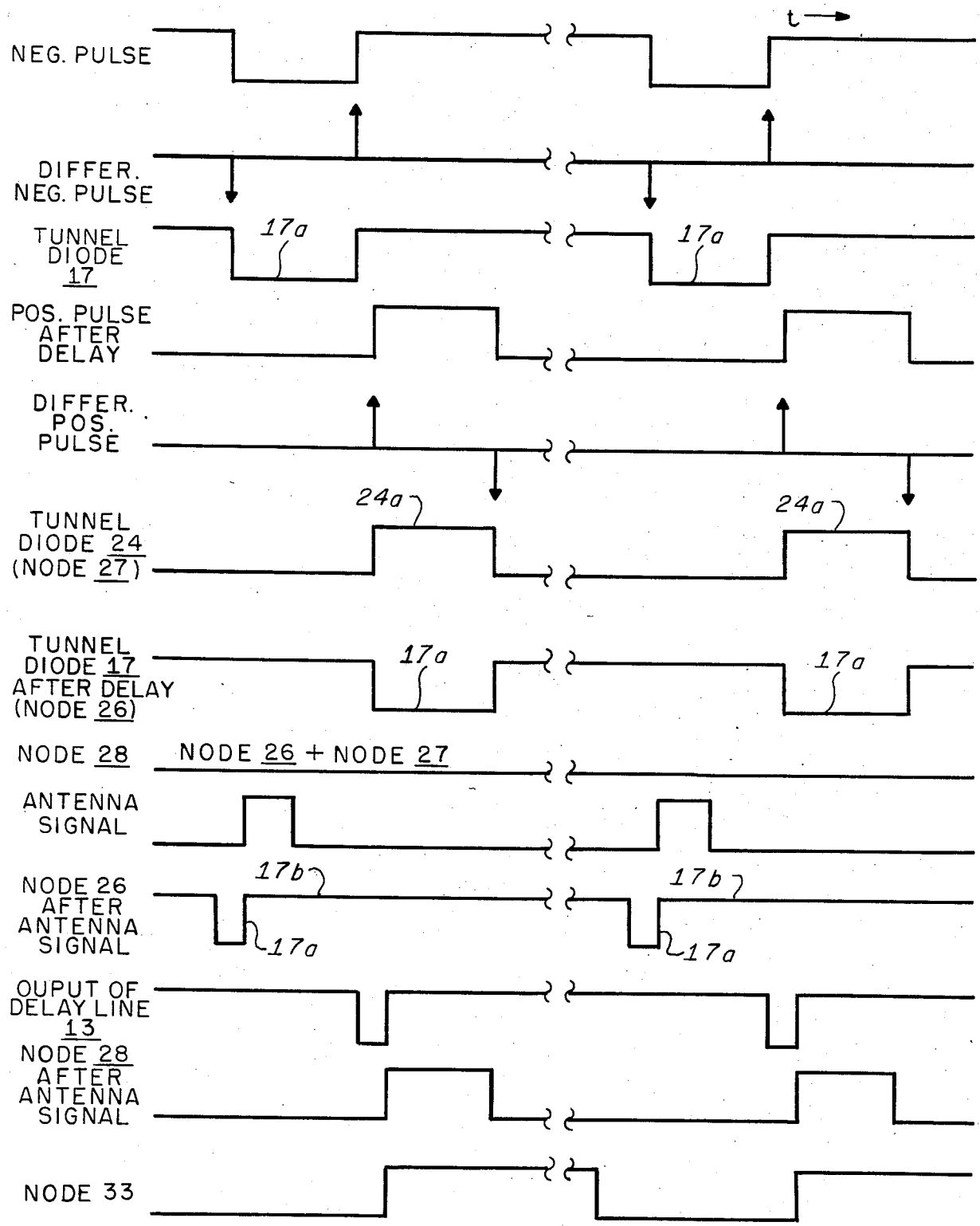
FIG. 2 includes a plurality of waveforms useful for explaining the invention.

Referring to FIG. 1, there is shown a schematic diagram of a baseband range gated receiver 10 wherein a range gate generator 11, activated by pulses from a clock 12, couples a negative-going pulse to capacitor 15 and a positive-going pulse to delay line 14. The negative-going and positive-going waveforms are shown in FIG. 2. The negative-going pulse at capacitor 15 is differentiated in a differentiating circuit including capacitor 15 and resistor 16, causing a negative impulse in response to the leading edge of the negative-going pulse and a positive impulse in response to the trailing edge of the negative-going pulse, as shown in FIG. 2, to be coupled to a tunnel diode 17, which may be a GE 262A. A bias voltage is applied to tunnel diode 17 via terminal 21 and resistor 16 to maintain tunnel diode 17 in its insensistive high state until a range gate signal is received. With the application of the negative impulse, resulting from the differentiation of the negative-going pulse, to the tunnel diode 17, the tunnel diode 17 is set to its sensitive low state 17a in FIG. 2.

Similarly, the delayed positive pulse from delay line 14 is differentiated in a differentiating circuit including capacitor 22 and resistor 23. The positive impulse generated in response to the leading edge of the positive pulse and the negative impulse generated in response to the trailing edge thereof, shown in FIG. 2, are coupled to a tunnel diode 24 positioned in the circuit with a polarity opposite to that of the tunnel diode 17. A negative voltage bias is coupled from terminal 25 and resistor 23 to tunnel diode 24 to maintain tunnel diode 24 in its insensitive high state until the positive impulse is received. When the positive impulse is coupled to the tunnel diode 24 it is set to its sensitive low state 24a in FIG. 2. After the coupling of the negative and positive impulses to tunnel diodes 17 and 24, respectively, substantially equal and opposite voltages exists at nodes 26 and 27. After the delay of the signal at node 26 by delay line 13, these voltages add, as shown in FIG. 2, to establish a voltage that is substantially zero at node 28. In the absence of a signal applied to the bridge at node 26 from antenna 31, tunnel diodes 17 and 24 remain in the sensitive low states and substantially zero voltage persists at node 28 for the duration of the range gate. At the expiration of the range gate the positive impulse generated in response to the trailing edge of the negative pulse and the negative impulse generated in response to the trailing edge of the positive pulse reset tunnel diodes 17 and 24, respectively, to the insensitive high states and a null continues to exist at node 28.

A voltage at node 26 due to the reception of a signal by antenna 31 during the range gate interval causes tunnel diode 17 to switch from the low state to its high state, thereby establishing a higher voltage level at node 26, causing the voltage at node 28 to increase from the substantially zero level as shown in FIG. 2. Once the received signal from antenna 31 returns the tunnel diode 17 to its high state 17b it cannot change states again until the impulse generated in response to the leading edge of the next negative-going pulse produced by the range gate generator. The tunnel diode 24, not coupled to the antenna 31, remains in its low state until the negative impulse generated in response to the trailing edge of the positive-going pulse produced by the range gate generator 11 causes it to reset to its high state, thereby re-establishing the substantially zero voltage level at node 28. Thus, a positive voltage exists at node 28 over the time interval from the reception of the signal by the antenna 31 and the conclusion of the range gate interval. This positive signal causes tunnel diode 32, which may be of the GaAs type, maintained in its low level state by a bias circuit not shown, to set to its high level state, thereby providing a positive voltage at node 33. This voltage causes one shot 34 to fire and couple a negative-going pulse to tunnel diode 32 causing it to reset to its low level state, thereby establishing a pulse at node 33, as shown in FIG. 2, that is entered into shift register 35 which is clocked substantially in synchronism with range gate 11 by odd pulse generator 36.

Design of the high sensitivity tunnel diode circuitry requires considerable care to prevent firing of the detector tunnel diode 17 during the range gate interval when the signal is not received by the antenna 31. The sensitivity of tunnel diode 17 is such that a signal leaked from range gate generator 11 can cause tunnel diode 17 to alter states and unbalance the bridge. To prevent this misfiring delay line 14 is introduced. With this delay, tunnel diode 17 is set to its low level state and reset to its high level state by the negative-going pulse from the range gate generator before the positive-going pulse is provided. Delay line 13 is coupled between nodes 26, 28 to obtain substantially equal delays between the range gate generator 11 and node 28 for the positive and negative-going pulse signals so that substantial signal cancellation is realized at node 28.

Pulses from node 33 are coupled to the serial input terminal of shift register 35 and entered into the stage thereof made available by the signals from the odd pulse generator 36. With each transmitted odd pulse, the register is shifted and signals representative of the state of tunnel diode 32 are entered into the available stage. Each register of shift register 35 is coupled via parallel output terminals, to a sum circuit 41 wherefrom, a signal corresponding to the number of low-to-high level stage transitions of the tunnel diode 32 is coupled to a detector 42 which provides an output signal at terminal 43 when the signal level coupled thereto from the sum circuit 41 exceeds a predetermined threshold.

With each even pulse, of the clock 12, even pulse generator 44 enables the next available stage of shift register 45 for a duration of the range interval. Since transmitter 46 is triggered only by the occurrence of the odd pulses from the odd pulse generator 36, the signals coupled to node 26 during the range gate generated in response to the even pulses that cause low-to-high state transitions of the tunnel diode 17 are due to interfering sources or noise. As previously described, positive impulses generated by the differentiation of the negative pulse from range gate generator 11 set the tunnel diode 17 to its low level state. Pulses caused by transitions to the high level state cause the bridge to become unbalanced establishing a voltage at node 28 that triggers tunnel diode 32 thus coupling a pulse, as previously described, to the available stage in shift register 45. With each successive even pulse, another stage is enabled and signals representative of the state of the tunnel diode 32 during the range gate interval are entered into the available stage. These signals are coupled to a sum network 49 via the parallel output terminals of the shift register 45. A signal representative of the number of low-to-high level state transitions of the tunnel diode 32 over a number of range gate intervals is coupled via resistor 16 to tunnel diode 17 to provide a continuously adjusted bias voltage thereto that is a function of the number of low-to-high transition of the tunnel diode 32 caused by noise or interfering signals.

Figure 3:
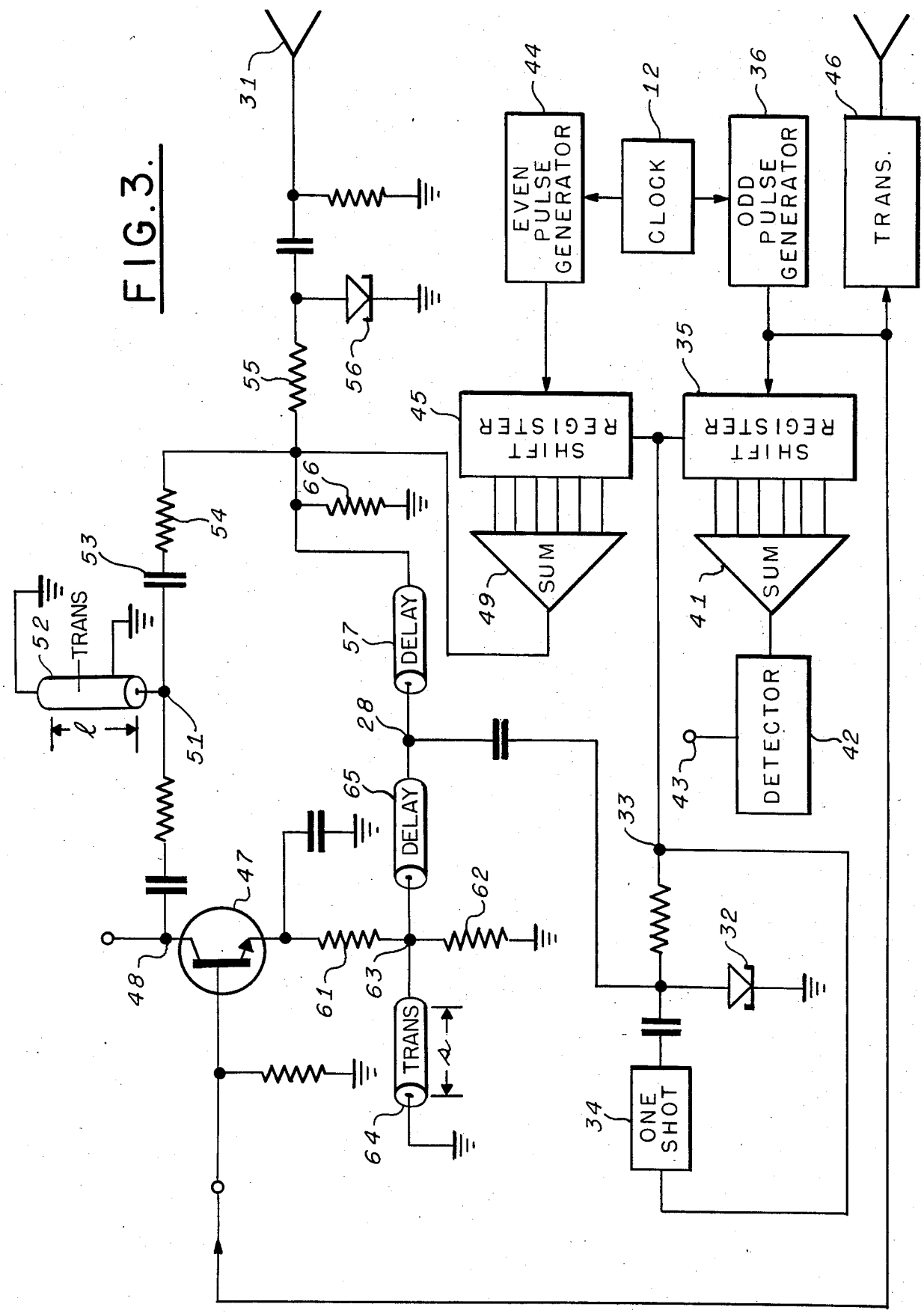
FIG. 3 is a schematic diagram of a second preferred embodiment of the invention.

A second embodiment of the invention is shown schematically in FIG. 3, wherein components similar to components shown in FIG. 1 bear similar reference numerals. A pulse from odd pulse generator 36 triggers transmitter 46 and causes avalanche transistor 47, which may be a 2N2369A, to conduct heavily. This conduction causes the voltage at node 48 to decrease causing a negative-going voltage to couple to the input terminal 51 of transmission line 52 which is short-circuited at a distance l from the input terminal 51. The negative-going voltage that propagates along the transmission line 52 is reflected by the short-circuit termination and arrives at the input terminal 51 in phase opposition to the voltage thereat at a time substantially given by 2l/c, c being the propagation velocity along the transmission line 52. When the reflected pulse arrives at the input terminal 51, the voltage thereat is cancelled thereafter, thereby establishing a pulse at the input terminal 51 of duration 2l/c. This pulse is differentiated in the differentiating network including capacitor 53 and resistors 54, 55 to couple a negative impulse and, at a pulse interval thereafter, a positive impulse to a tunnel diode 56, which may be a GE262A. In the absence of a signal coupled from the antenna 31, tunnel diode 56 is set in its low level state during the pulse length interval and couples a negative voltage to a node 28 via delay line 57.

When transistor 47 conducts, the current therethrough is coupled through resistors 61, 62 to estagblish a positive-going voltage at the input terminal 63 of transmission line 64 which is terminated with a short-circuit at a distance s from the input terminal 63. In a manner similar to that described with respect to transmission line 52, a positive pulse of duration 2s/c is formed at the terminal 63 and coupled via delay line 65 to node 28. The length of transmission lines 52,64 are substantially equal and the pulses formed thereby are of substantially equal duration. Resistors 61,62 and the resistor 66 coupled between the input to delay line 57 and ground, are selected to establish a voltage at node 28 consistent with the low level state of tunnel diode 32. When antenna 31 does not receive a signal within the range gate interval, the signal at node 28 remains at the low level, tunnel diode 32 does not change state and the tunnel diode 56 is reset to its high level state by the positive impulse due to the differentiation of the trailing edge of the negative-going pulse coupled from the pulse forming transmission line 52. If a signal is received by antenna 31, tunnel diode 56 fires, coupling a high level signal to node 28 causing tunnel diode 32 to change from its low level to its high level state thereby providing a pulse from node 33 to shift register 35 for processing as previously described.

While the invention has been described in its preferrred embodiments, it is to be understood that the words which have been used are words of description rather than limitation and that changes may be made within the purview of the appended claims without departing from the true scope and spirit of the invention in its broader aspects.

We claim:

1. An apparatus for detecting pulsed signals comprising:
   means for receiving said pulse signals;
   first bistable means having first and second switchable stable states for switching from said first state to said second state in response to pulse signals coupled thereto from said receiving means;
   second bistable means having first and second switchable stable states coupled to said first bistable means with a node therebetween, said node having substantially a low level signal thereat when said first and second bistable means are in said first state and a detectable level signal when a pulsed signal from said receiving means causes said first bistable means to switch to said second stable state;
   third bistable means having first and second switchable stable states coupled to said node and responsive to said detectable level signal for switching from said first stable state to said second stable state, thereby generating an output pulsed signal;
   generator means for providing first and second pulses of substantially equal duration and opposite polarity;
   first means coupled between said generator means and said first bistable means for receiving and differentiating said first pulses; and
   second means coupled between said generator means and said second bistable means for receiving and differentiating said second pulses.

2. An apparatus in accordance with claim 1 further including:
   first delay means coupled between said first bistable means and said node for delaying signals for a first time duration; and
   second delay means coupled between said generator means and said second differentiating means for delaying signals for a second time duration, said first and second time durations chosen such that signals from said first and second bistable means substantially coalesce at said node.

3. An apparatus in accordance with claims 1, 2, or 5 further including means having an input terminal coupled to said third bistable means and an output terminal coupled to said third bistable means for providing a signal at a predetermined time after a change of state of said third bistable means from said first state to said second state to reset said third bistable means to said first stable state.

4. An apparatus in accordance with claims 1, 2, or 5 wherein said first and second bistable means are germanium tunnel diodes and said third bistable means is a gallium arsenide tunnel diode.

5. An apparatus in accordance with claim 3 further including:
   first delay means coupled between said first bistable means and said node for delaying signals for a first time duration; and
   second delay means coupled between said generator means and said differentiating means for delaying signals for a second time duration, said first and second time durations chosen such that signals from said first and second bistable means substantially coalesce at said node.

6. An apparatus for detecting pulsed signals comprising:
   first delay means coupled between a first node and a second node for delaying signals coupled thereto from said second node for a first time duration;
   second delay means coupled between said first node and a third node for delaying signals coupled thereto from said third node for a second time duration;
   means coupled to said third node for receiving said pulsed signals;
   gating signal generator means coupled to said second and third nodes for generating pulsed signals at said second and third nodes that are substantially in phase opposition, said first and second delay means being chosen such that said pulse signals from said gating signal generator means substantially coalesce at said first node;
   first bistable means, having first and second switchable stable states, coupled to said third node, set in said first stable state in response to a leading edge of said pulsed signal at said third node and reset in response to a trailing edge thereof, and switchable from said first stable state to said second stable state in response to received pulse signals; and second bistable means having a first and second switchable stable states coupled to said first node and responsive to pulse signals thereat to switch from said first stable state to said second stable state thereby generating an output pulse signal.

7. An apparatus in accordance with claim 6 wherein said gating signal generator means includes:

switch means having first and second terminals responsive to a signal coupled to an input terminal thereof for conducting current between said first and second terminals for the duration of said coupled signal;

first pulse means coupled to said first terminal of said switch means and said second node for providing a signal of predetermined polarity for the duration of current flow between said first and second terminals of said switch means;

second pulse means coupled to said second terminal of said switch means for providing a signal of polarity opposite said predetermined polarity for the duration of said signal flow between said first and second terminals of said switch means; and means coupled between said second pulse means and said third node for differentiating said signal of polarity opposite said predetermined polarity.

8. An apparatus in accordance with claim 7 wherein said switch means is an avalanche transistor.

9. An apparatus in accordance with claims 6, 7, or 8 wherein said first bistable means is a germanium tunnel diode and said second bistable means is a gallium arsenide tunnel diode.

* * * * *